United States Patent
Pal

(10) Patent No.: US 8,897,023 B2
(45) Date of Patent: Nov. 25, 2014

(54) MOTOR CONTROLLER ASSEMBLY WITH CAPACITOR THERMAL ISOLATION

(75) Inventor: Debabrata Pal, Hoffman Estates, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 1146 days.

(21) Appl. No.: 12/466,444

(22) Filed: May 15, 2009

(65) Prior Publication Data

US 2010/0290204 A1 Nov. 18, 2010

(51) Int. Cl.
*H05K 1/00* (2006.01)
*H05K 7/14* (2006.01)

(52) U.S. Cl.
CPC .................. *H05K 7/1432* (2013.01)
USPC ........ 361/749; 361/272; 361/306.1; 361/760; 361/739; 257/712; 174/50; 174/260; 174/252; 174/254

(58) Field of Classification Search
USPC ...................... 361/749, 272, 306.1, 760, 739; 257/712; 174/50, 260, 252, 254
See application file for complete search history.

(56) References Cited

U.S. PATENT DOCUMENTS

| | | | | |
|---|---|---|---|---|
| 3,581,470 | A | * | 6/1971 | Aitkenhead et al. ............... 96/79 |
| 4,015,969 | A | * | 4/1977 | Brown et al. .................... 65/289 |
| 4,030,172 | A | * | 6/1977 | Gentry ........................... 29/6.01 |
| 4,077,791 | A | * | 3/1978 | Oelke ............................. 65/273 |
| 4,109,120 | A | * | 8/1978 | Tyler ........................... 200/51 R |
| 4,193,785 | A | * | 3/1980 | Bailey ............................. 65/285 |
| 4,198,671 | A | * | 4/1980 | Donigan et al. ........... 361/306.1 |
| 4,254,186 | A | * | 3/1981 | Acitelli et al. ................. 428/462 |
| 4,281,306 | A | * | 7/1981 | Schoendube ..................... 336/5 |
| 4,436,953 | A | * | 3/1984 | Gottlieb ...................... 174/72 B |
| 4,518,982 | A | * | 5/1985 | Du Bois et al. ................ 257/796 |
| 4,546,300 | A | * | 10/1985 | Shaikh .......................... 318/786 |
| 4,585,178 | A | * | 4/1986 | Arzt ................................ 241/23 |
| 4,668,358 | A | * | 5/1987 | Ball .............................. 204/489 |
| 4,902,551 | A | * | 2/1990 | Nakaso et al. ................ 428/137 |
| 5,027,255 | A | * | 6/1991 | Zeitlin et al. .................. 361/739 |

(Continued)

FOREIGN PATENT DOCUMENTS

DE 10057140 A1 6/2002
EP 0688092 A2 12/1995

OTHER PUBLICATIONS

Extended European Search Report for Application No. EP 10 16 2876 mailed Feb. 22, 2011.

*Primary Examiner* — Xiaoliang Chen
(74) *Attorney, Agent, or Firm* — Carlson, Gaskey & Olds, P.C.

(57) ABSTRACT

An electrical assembly for a motor controller is disclosed that includes an electrical lead. The electrical lead has a conductive trace within an insulating material and that extends a length between first and second ends. An electrical pad is in electrical continuity with and extends from the conductive trace through the insulating material at the first end. The pad includes an aperture providing a securing feature. An electrical component is supported by and integral with the second end, in one example. The electrical component is in electrical continuity with the conductive trace at the second end. A bus bar provides a joint having a first cross-sectional area. The electrical lead is flexible and is removably secured to the joint by the securing feature to provide electrical continuity from a capacitor to the bus bar. The flexible electrical lead has a second cross-sectional area substantially less than the first cross-sectional area.

11 Claims, 4 Drawing Sheets

(56) References Cited

U.S. PATENT DOCUMENTS

| | | | |
|---|---|---|---|
| 5,103,293 A * | 4/1992 | Bonafino et al. | 257/702 |
| 5,436,569 A * | 7/1995 | Melgaard et al. | 324/750.03 |
| 5,567,991 A * | 10/1996 | Schantz et al. | 307/10.1 |
| 5,616,888 A * | 4/1997 | McLaughlin et al. | 174/260 |
| 5,638,255 A * | 6/1997 | Bobadilla et al. | 361/624 |
| 5,856,913 A * | 1/1999 | Heilbronner | 361/760 |
| 6,018,233 A | 1/2000 | Glennon | |
| 6,021,040 A | 2/2000 | Suzuki et al. | |
| 6,037,752 A | 3/2000 | Glennon | |
| 6,244,716 B1 * | 6/2001 | Steenwyk et al. | 359/603 |
| 6,290,509 B1 * | 9/2001 | Hattori et al. | 439/76.2 |
| 6,462,429 B1 | 10/2002 | Dhyanchand et al. | |
| 6,552,912 B1 | 4/2003 | Kanazawa et al. | |
| 6,599,135 B2 * | 7/2003 | Yamane | 439/76.2 |
| 6,677,521 B2 * | 1/2004 | Sumida et al. | 174/50 |
| 6,703,792 B2 * | 3/2004 | Kawada et al. | 315/169.4 |
| 6,788,406 B2 | 9/2004 | Ross | |
| 6,835,898 B2 | 12/2004 | Eldridge et al. | |
| 7,225,538 B2 | 6/2007 | Eldridge et al. | |
| 7,327,582 B2 | 2/2008 | Casper et al. | |
| 7,419,386 B2 * | 9/2008 | Washihira | 439/76.2 |
| 7,449,381 B2 | 11/2008 | Das et al. | |
| 7,479,746 B2 | 1/2009 | Rozman et al. | |
| 2002/0050375 A1 * | 5/2002 | Sumida et al. | 174/50 |
| 2002/0089056 A1 * | 7/2002 | Eady et al. | 257/712 |
| 2002/0191365 A1 * | 12/2002 | Byler et al. | 361/301.3 |
| 2003/0116348 A1 * | 6/2003 | Nakatani et al. | 174/260 |
| 2007/0002594 A1 | 1/2007 | Otsuka et al. | |
| 2007/0057731 A1 * | 3/2007 | Le | 330/302 |
| 2008/0121416 A1 * | 5/2008 | Hirai et al. | 174/259 |
| 2008/0121481 A1 * | 5/2008 | Mitsuhashi et al. | 191/10 |
| 2008/0286585 A1 | 11/2008 | Lem | |
| 2009/0124119 A1 * | 5/2009 | Austin | 439/517 |
| 2009/0151989 A1 * | 6/2009 | Hunrath | 174/257 |
| 2009/0267720 A1 * | 10/2009 | MacLennan et al. | 336/229 |
| 2010/0053927 A1 * | 3/2010 | Inoue et al. | 361/830 |
| 2010/0084001 A1 * | 4/2010 | Tsunomura et al. | 136/244 |
| 2010/0117570 A1 * | 5/2010 | Nishimori et al. | 318/400.3 |
| 2010/0172117 A1 * | 7/2010 | Imai | 361/820 |
| 2010/0200979 A1 * | 8/2010 | Blair et al. | 257/691 |

\* cited by examiner

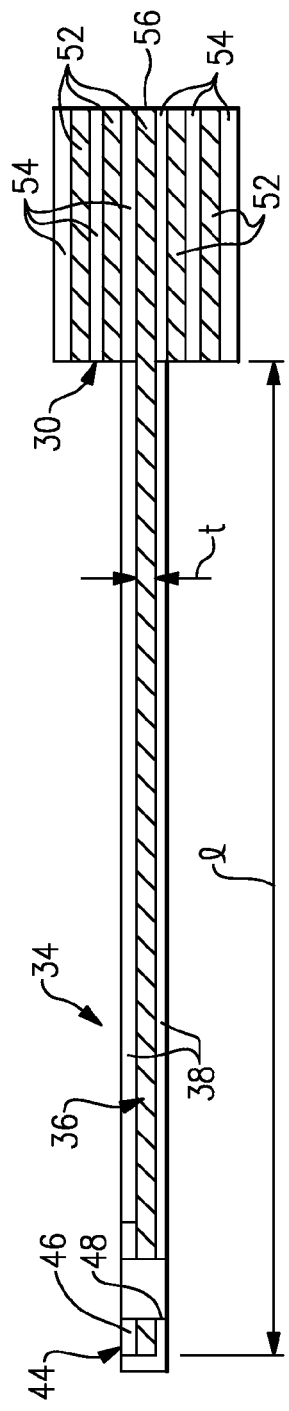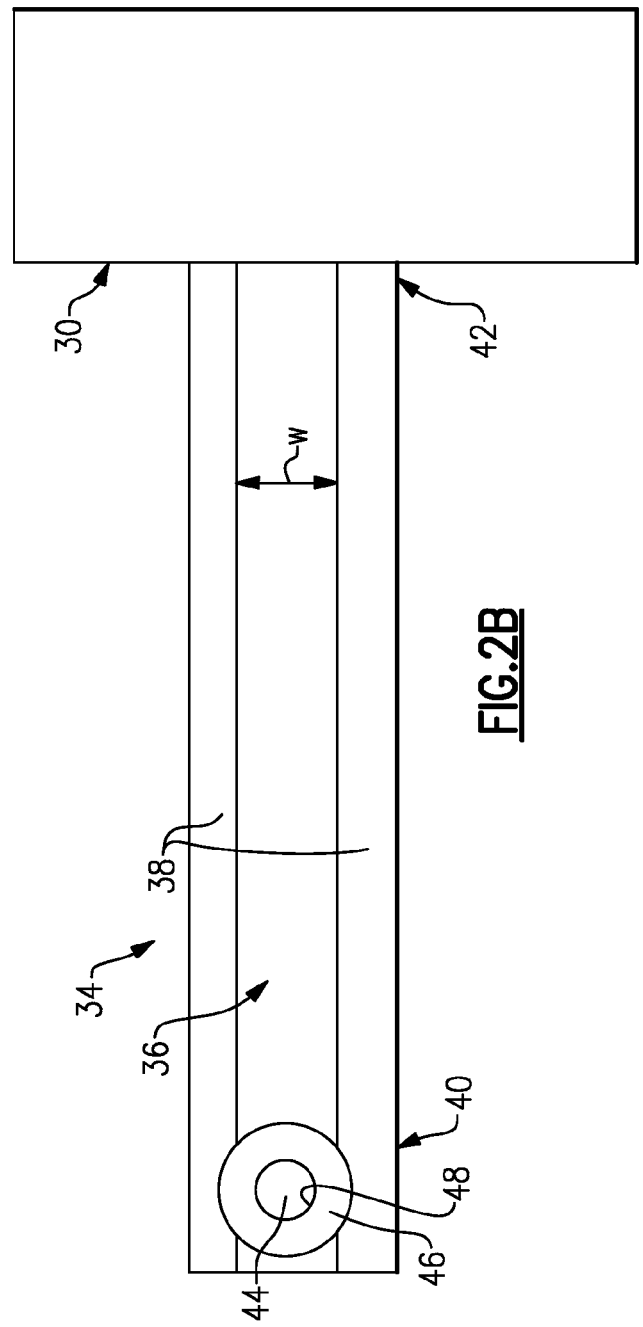

MOTOR CONTROLLER ASSEMBLY WITH CAPACITOR THERMAL ISOLATION

BACKGROUND

This disclosure relates to a motor controller suitable for an aircraft electric starter motor, such as main and APU engine start, cabin air compressor motor, nitrogen gas generation system motor, and hydraulic motor applications, for example. More particularly, the disclosure relates to an apparatus and method for electrically connecting a thermally sensitive electrical component to a bus bar.

Electric starter motors are used in the aircraft industry to rotationally drive a gas turbine engine during a starting procedure. The motor controller includes inductors used in input filter and output filters that are connected to input or output bus bars. In one example, the bus bar typically conducts 220-240 amps, and up to 480 amps for brief periods, which generates heat within the bus bar. Bus bar temperature can reach up to of approximately 130-150° C. during these periods.

A motor controller houses the input and output filters which include inductors and capacitors. In one example, a printed wiring board (PWB) is mounted to a chassis. One or more capacitors are supported on the PWB and are typically only provided a few amps of current. The bus bar is secured directly to the printed wiring board. As a result, a significant amount of heat is transmitted from the bus bar to the PWB and the capacitors. A typical maximum operating temperature capacity of the capacitors is 105° C. The bus bars may conduct heat to the capacitors such that they operate beyond their maximum temperature limit.

SUMMARY

An electrical assembly for a motor controller is disclosed that includes an electrical lead. The electrical lead has a conductive trace within an insulating material and that extends a length between first and second ends. An electrical pad is in electrical continuity with and extends from the conductive trace through the insulating material at the first end. The pad includes an aperture providing a securing feature. An electrical component is supported by and integral with the second end, in one example. The electrical component, which is a printed wiring board or a capacitor, for example, is in electrical continuity with the conductive trace at the second end.

In another aspect of the disclosure, a bus bar provides a joint having a first cross-sectional area. The electrical lead is flexible and is removably secured to the joint by the securing feature to provide electrical continuity from a capacitor to the bus bar. The flexible electrical lead has a second cross-sectional area substantially less than the first cross-sectional area.

These and other features of the disclosure can be best understood from the following specification and drawings, the following of which is a brief description.

BRIEF DESCRIPTION OF THE DRAWINGS

FIG. 2A is a cross-sectional side elevational view of the disclosed printed wiring board (PWB) and its electrical lead.

FIG. 2B is a cross-sectional top elevational view of the PWB shown in FIG. 2A.

DETAILED DESCRIPTION

Figure 1A:
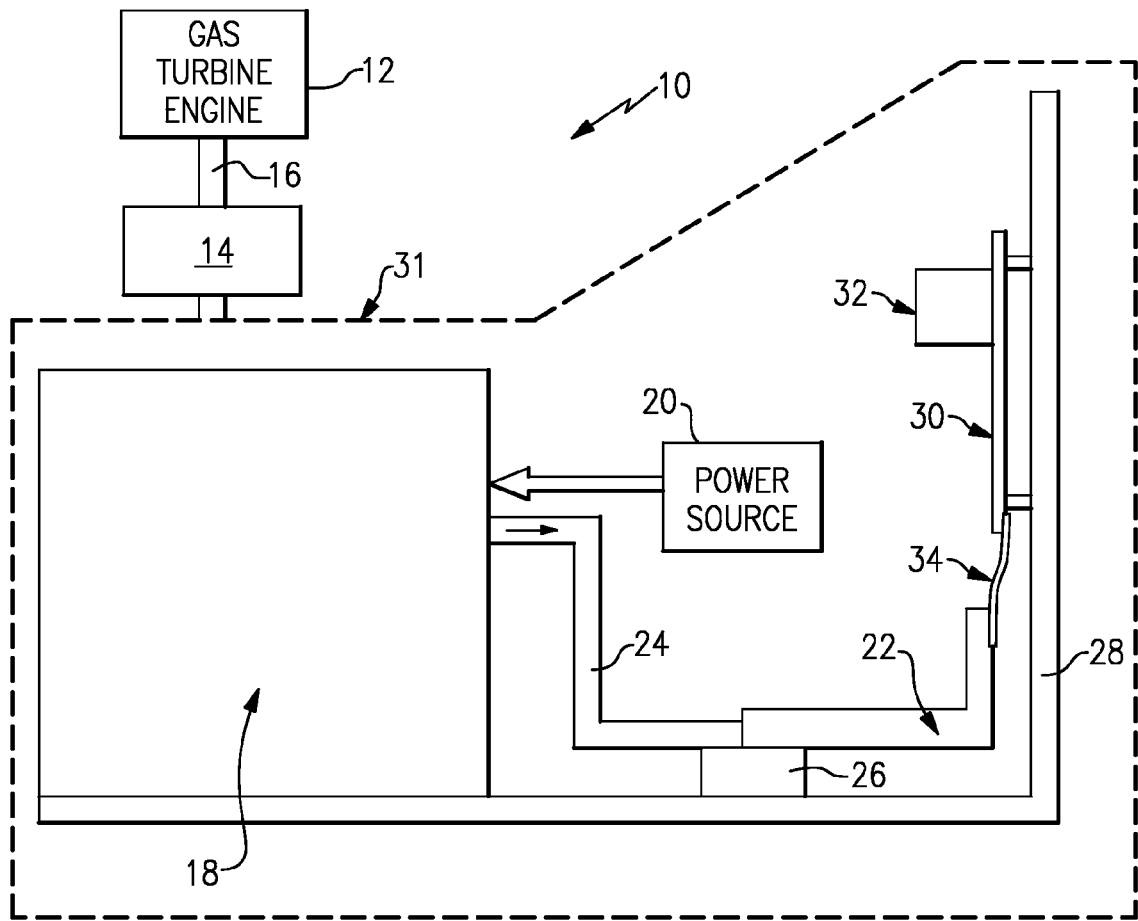
FIG. 1A is a schematic view of a motor starter controller used to start an aircraft gas turbine engine.

A gas turbine engine 12 for an aircraft 10 is schematically shown in FIG. 1. A starter motor/generator 14 is interconnected to the gas turbine engine 12 by a mechanical coupling 16, such as a gear box. A motor controller 31 includes input and output filter inductors. In this embodiment, an inductor 18 on the output filter is shown. This inductor 18 receives power from a power source 20 and transmits power to the bus bar 22 through wires 24. The arrows indicate the flow of current. The bus bar 22, typically constructed from copper, receives 220 amps in a steady state condition and 480 amps in a transient starting condition for up to three minutes, for example. As a result, the bus bar may reach temperatures of approximately 130-150° C.

The motor controller 31 regulates operation of the starter motor 14. The controller 31 includes a chassis 28 to which a printed wiring board (PWB) 30 is attached, typically with stand-offs and fasteners. In one example, the bus bar 22 is supported on the chassis 28 using a mount 26. One or more capacitors 32 are supported by and electrically connected to, or in electrical continuity with, the PWB 30.

Figure 1B:
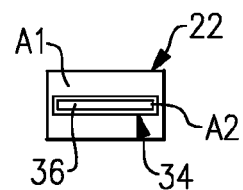
FIG. 1B is a cross-sectional view of a bus bar and an electrical lead according to this disclosure, which schematically illustrates the relative size of the bus bar and electrical lead rather than their physical connection to one another.

In the disclosed embodiment, a flexible electrical lead 34 interconnects the PWB 30 to the bus bar 22 to electrically connect the capacitor 32 to the bus bar 22, but thermally isolates the capacitor 32 from the conducted heat of the bus bar 22. The capacitor 32 only uses a few amps (1.33 A) in one example. The bus bar 22 includes a cross-section A1, and the electrical lead 34 has a conductive trace 36 (FIGS. 2A and 2B) that has a cross-section A2 substantially less than the cross-section A1, which prevents a significant amount of heat from being transmitted from the bus bar 22 to the capacitor 32 through the electrical lead 34. In one example, the cross-section A2 is 2.5% or less than the cross-section A1, as schematically illustrated in FIG. 1B. Smaller cross-section of the conductor trace from the bus bar to the PWB 30 reduces the amount of conducted heat.

Referring to FIGS. 2A and 2B, the PWB 30 is constructed from multiple electrically conductive layers, such as copper layers 52. The copper layers 52 are electrically isolated from one another by insulating layers 54, which are constructed from a pre-preg resin material, for example. The multiple copper layers 52 are used to reduce electrical noise.

In one example, the electrical lead 34 includes a conductive trace 36 extending from the PWB 30. For example, one of the layers 56 of the copper layers 52 extends from the PWB a length l. That is, the conductive trace 36 extends beyond the dimensions of the PWB 30, which is provided by the insulating layers 54. As a result, the conductive trace 36 is a continuous portion of copper that extends from and is provided by one of the copper layers 52. The conductive trace 36 is generally rectangular in shape and includes a thickness t that is substantially less than its width W. The conductive trace 36 is sandwiched between layers of an insulator 38, which are constructed from a polyimide in one example, to form a flexible ribbon-like electrical lead. The insulator 38 is constructed from a different material than the insulating layers 54 and extends from a second end 42 adjacent to the PWB 30 to a first end 40. The insulator 38 can also be constructed from a polyester, polyethersulfone and/or polyparabanic acid, for example.

The first end 40 includes a securing feature 44, which is provided by an electrically conductive pad 46 interconnected to the conductive trace 36 and extending through the insulator 38. The pad 46 includes a hole 48 that receives a fastener 50 (FIGS. 3 and 4A) that is secured to the bus bar 22.

Figure 3:
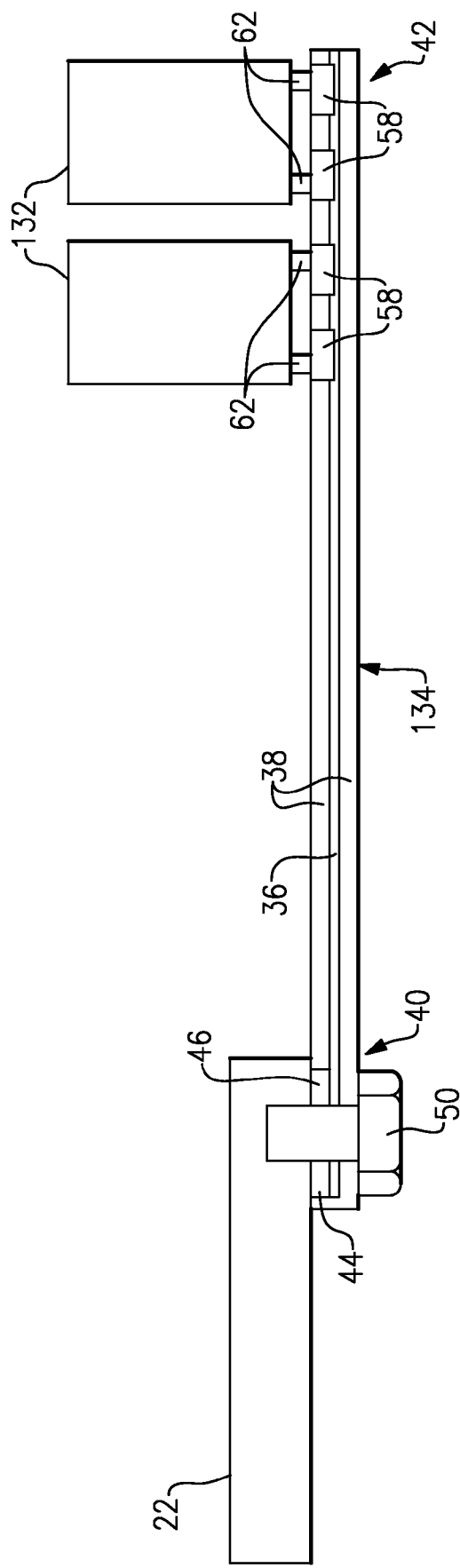
FIG. 3 is a schematic view of a disclosed example electrical lead electrically interconnecting a bus bar and a capacitor.

Referring to FIG. 3, the securing feature 44 is shown with the pad 46 arranged adjacent to an engagement with the bus bar 22. The fastener 50 is a bolt, for example, that is received within a threaded hole in the bus bar 22 and is used to removably secure the electrical lead 134 to the bus bar 22. The electrical lead 134 includes electrically conductive pads 58 arranged at the second end 42 that are directly connected to electrical connections 62 provided by the capacitors 132, for example, by using solder. That is, a PWB is not provided between the capacitors 132 and the electrical lead 134. The capacitors 132 may also be soldered directly to the conductive trace 36.

Figure 4A:
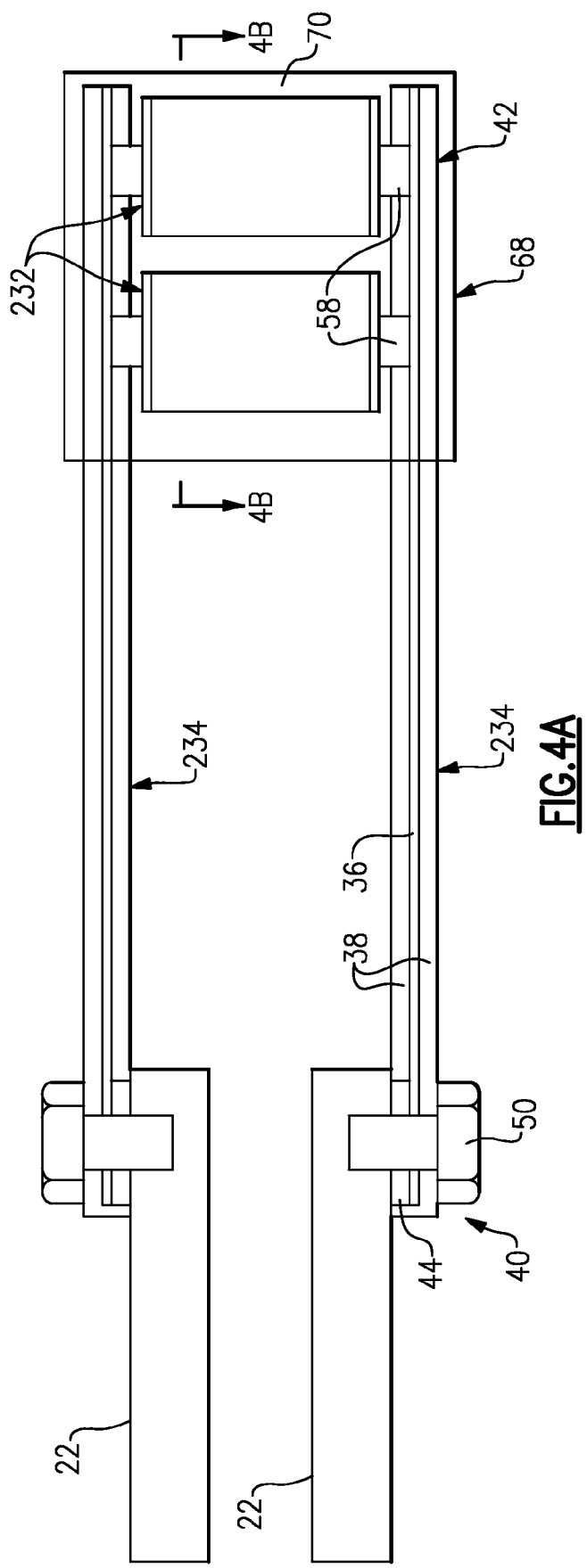
FIG. 4A is a cross-sectional side elevational view of another arrangement of electrical leads electrically interconnecting bus bars and capacitors.
Figure 4B:
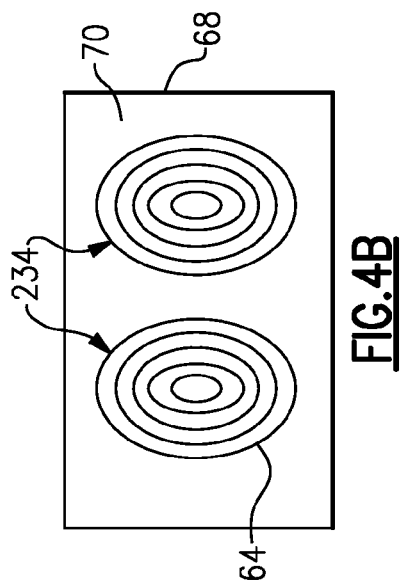
FIG. 4B is a cross-sectional view of a capacitor housing shown in FIG. 4A taken along line 4B-4B.

Another example arrangement is illustrated in FIGS. 4A and 4B. One or more capacitors 232 are arranged between a pair of electrical leads 234. The electrical leads 234 include electrically conductive pads 58 provided on their respective traces 36. In the example shown, the capacitors 232 are film capacitors including a film 64 wound about itself. The capacitors 232 extend between sprayed metalized end surfaces of the capacitors and are electrically connected to the electrically conductive pads 58 on each electrical lead 234 using solder, for example. The capacitors 232 and the second ends 42 of the electrical leads 234 are arranged within a housing 68 that is filled with a potting material 70.

Although example embodiments have been disclosed, a worker of ordinary skill in this art would recognize that certain modifications would come within the scope of the claims. For that reason, the following claims should be studied to determine their true scope and content.

What is claimed is:

1. A motor controller comprising:
 a capacitor;
 a bus bar providing a joint having a first cross-sectional area;
 a flexible electrical lead removably secured to the joint to provide electrical continuity from the capacitor to the bus bar, the flexible electrical lead having a second cross-sectional area substantially less than the first cross-sectional area.

2. The motor controller according to claim 1, wherein the flexible electrical lead includes a conductive trace covered in a polyimide insulating material.

3. The motor controller according to claim 2, wherein the bus bar and the conductive trace comprise copper.

4. The motor controller according to claim 2, wherein the flexible electrical lead includes a conductive pad extending from the conductive trace through the insulating material at the first end, the conductive pad including an aperture providing a securing feature.

5. The motor controller according to claim 4, wherein flexible electrical lead includes a generally rectangular cross-section, and comprising a fastening element extending through the aperture and removably securing the first end to the bus bar.

6. The motor controller according to claim 1, comprising a printed wiring board supporting the capacitor and a second end of the flexible electrical lead, which is opposite a first end of the flexible electrical lead that is secured to the bus bar, the printed wiring board including a conductive layer providing electrical continuity between the second end and the capacitor.

7. The motor controller according to claim 1, wherein the flexible electrical lead is connected directly to the capacitor at a second end of the flexible electrical lead.

8. The motor controller according to claim 7, comprising a housing surrounding the second end and the capacitor, the flexible electrical lead extending through the housing to a first end, the housing filled with a potting material.

9. The motor controller according to claim 1, comprising an inductor and a chassis, the bus bar and the capacitor supported by the chassis, and the bus bar electrically connected between the inductor and the capacitor.

10. The motor controller according to claim 1, wherein the second cross-sectional area is 2.5 percent or less than the first cross-sectional area.

11. The motor controller according to claim 1, wherein the bus bar is configured to provide 220 amps in a steady state condition and 480 amps in a transient starting condition.

* * * * *